(12) United States Patent
Hinkle et al.

(10) Patent No.: US 7,606,378 B2
(45) Date of Patent: Oct. 20, 2009

(54) RADIO DISTORTION PROCESSING

(75) Inventors: Joseph A Hinkle, Huntsville, AL (US); David J Madaj, Ann Arbor, MI (US)

(73) Assignees: Chrysler Group LLC, Auburn Hills, MI (US); Siemens VDO Automotive Electronics Corp., Huntsville, AL (US)

( * ) Notice: Subject to any disclaimer, the term of this patent is extended or adjusted under 35 U.S.C. 154(b) by 1071 days.

(21) Appl. No.: 09/833,183

(22) Filed: Apr. 11, 2001

(65) Prior Publication Data

US 2002/0150266 A1     Oct. 17, 2002

(51) Int. Cl.
H03G 3/00      (2006.01)
H03G 9/00      (2006.01)

(52) U.S. Cl. .................. 381/107; 381/108; 381/55; 381/102

(58) Field of Classification Search .................. 381/102, 381/104–109, 94.5, 94.8, 55, 57–59; 455/219
See application file for complete search history.

(56) References Cited

U.S. PATENT DOCUMENTS

| | | | |
|---|---|---|---|
| 4,076,959 A | 2/1978 | Gilbert et al. | |
| 4,207,526 A | 6/1980 | Abt | |
| 4,207,527 A | 6/1980 | Abt | |
| 4,752,960 A | 6/1988 | Scholz | |
| 4,864,246 A | 9/1989 | Kato et al. | |
| 4,912,424 A * | 3/1990 | Nicola et al. | 330/141 |
| 5,255,324 A * | 10/1993 | Brewer et al. | 381/107 |
| 5,305,388 A | 4/1994 | Konno | |
| 5,430,409 A | 7/1995 | Buck et al. | |
| 5,442,316 A | 8/1995 | Buck et al. | |
| 5,453,716 A | 9/1995 | Person et al. | |
| 5,469,510 A | 11/1995 | Blind et al. | |
| 5,483,692 A | 1/1996 | Person et al. | |
| 5,574,792 A | 11/1996 | Konno | |
| 5,633,940 A * | 5/1997 | Wassink | 381/107 |
| 5,883,963 A | 3/1999 | Tonella | |
| 5,907,622 A | 5/1999 | Dougherty | |
| 6,061,455 A | 5/2000 | Hadley et al. | |
| 6,078,670 A | 6/2000 | Beyer | |
| 6,088,461 A | 7/2000 | Lin et al. | |
| 6,154,550 A | 11/2000 | Beyer | |

* cited by examiner

Primary Examiner—Xu Mei
(74) Attorney, Agent, or Firm—Ralph E. Smith

(57) ABSTRACT

A method for audio distortion processing is provided, whereby narrowband and wideband gains are incrementally reduced and recovered for controlling audio distortion of an audio reproduction system. Reduction limits are determined for both the narrowband and wideband gains, as a function of operator controlled inputs. If clipping is detected, the narrowband gain is initially reduced until either the narrowband gain reduction limit has been achieved or the clipping desists. The wideband gain is subsequently reduced if the reduction limit of the narrowband gain has been achieved and the clipping persists. The wideband gain is reduced until either the wideband gain reduction limit has been achieved or the clipping desists. After the clipping desists, a gain recovery process ensues, whereby the wideband gain is initially recovered until at its original level and the narrowband gain is subsequently recovered until reaching its original level.

15 Claims, 2 Drawing Sheets

RADIO DISTORTION PROCESSING

FIELD OF THE INVENTION

The present invention relates generally to audio systems that limit radio distortion, and more particularly to an improved method for limiting radio distortion.

BACKGROUND

In general, audio reproduction systems are designed to produce a specific amount of audio power while specifically limiting the amount of audio distortion. Conventional audio reproduction systems include an audio source, such as an AM/FM tuner, a cassette deck, a CD player, or the like, that feeds a digital audio signal to a digital signal processor (DSP). The DSP includes a variable gain amplification stage for processing the audio signal and feeding an output signal through a fixed-gain power amplifier to a speaker or plurality of speakers. The DSP receives operator inputs such as volume and tone control (e.g. bass boost, treble and the like) for varying the amplification of respective frequencies during the variable gain amplification stage.

Audio distortion can occur when an operator increases the volume amplification and/or boosts any of the tone controls. The amplified audio signal (i.e. power amplifier output signal) may grow to the point where its amplitude approaches the power supply voltage limits. Typical power amplifiers include clipping circuits for "clipping" the signal peaks as they reach the power supply limit. Clipping of the audio signal is undesirable in that it causes new audio components to be introduced into the original signal. The new audio components occur at odd harmonics of the frequency associated with the clipped signal, thus distorting the original audio signal.

Prior art methods for controlling distortion include: implementation of voltage limiting or compression to the input of a power amplifier to prevent clipping, comparing the power output signal to a predetermined reference and attenuating the signal when the output signal exceeds the predetermined reference, or separating the audio signal into separate paths for bass frequencies and higher frequencies, then reducing the gain of each path upon the occurrence of a peak level. Each of these methods, however, includes associated disadvantages that inhibit cost efficient implementation.

Another method for controlling distortion provides a micro-controller for managing the operation of an audio system having a DSP that controls a wideband and a narrowband gain for the audio signal. Clipping is avoided by sensing clipping in the power amplifier and initially reducing the narrowband gain and subsequently reducing the wideband gain if clipping persists. Upon cessation of clipping, the narrowband gain is initially restored and the wideband gain is subsequently restored if clipping is still not sensed. This method, however, includes certain disadvantages including a fixed value of reduction in each of the gains and the order of restoring the previously reduced gains.

SUMMARY OF THE INVENTION

A preferred embodiment of the present invention provides an audio system comprising an audio source, a first processing unit in electrical communication with the audio source wherein the first processing unit controls a plurality of parameters. A plurality of inputs are also provided and are in electrical communication with the first processing source, whereby the plurality of inputs affect the plurality of parameters. A power amplifier is included and is in electrical communication with the first processing unit for receiving an output signal of the first processing unit, the power amplifier selectively generating a clipping signal and further in electrical communication with at least one speaker. A second processing unit is in electrical communication with the power amplifier and the first processing unit for receiving the clipping signal from the power amplifier and sending a control signal to the first processing unit. The control signal initiates at least one of either an incremental reduction in a level of a first parameter of the plurality of parameters until one of either the clipping signal recedes or a reduction limit of the first input is achieved and incremental reduction in a level of a second parameter of the plurality of parameters if a reduction limit of the first parameter is achieved and the clipping signal persists, or an incremental recovery of an original level of the second parameter if the clipping signal is not detected and an incremental recovery of an original level of the first parameter if the original level of the second parameter is recovered and the clipping signal is not detected.

The present invention further provides a method for controlling distortion in an audio system having at least a volume and a bass parameter wherein each of the parameters is a function of an operator input. The method comprises the steps of determining a reduction limit of the bass parameter, determining a reduction limit of the volume parameter, detecting a clipping signal in the audio system, incrementally reducing a level of the bass parameter until one of either the clipping signal recedes or the reduction limit of the bass parameter is achieved, incrementally reducing a level of the volume parameter if the reduction limit of the bass parameter is achieved and the clipping signal persists, and incrementally recovering an original level of the volume parameter if the clipping signal is not detected and incrementally recovering an original level of the bass parameter if the original level of the volume parameter is recovered and the clipping signal is not detected.

Further areas of applicability of the present invention will become apparent from the detailed description provided hereinafter. It should be understood however that the detailed description and specific examples, while indicating preferred embodiments of the invention, are intended for purposes of illustration only, since various changes and modifications within the spirit and scope of the invention will become apparent to those skilled in the art from this detailed description.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 1:
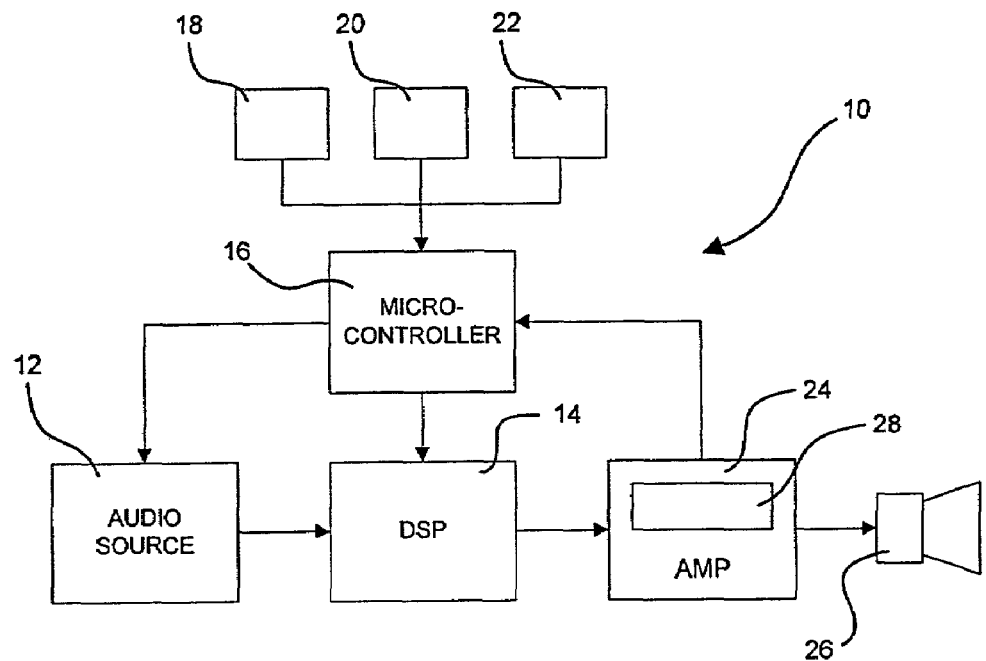
FIG. 1 is schematic diagram of an audio reproduction system according to the principles of the present invention.

With particular reference to FIG. 1, an audio reproduction system 10 is shown. The audio reproduction system 10 includes an audio source 12, such as an AM/FM tuner, a cassette deck, a CD player, or the like, that is in electrical communication with an audio processor 14, such as a digital signal processor (DSP). The audio source 12 generates an audio signal and feeds the signal to the DSP 14. A micro-controller 16 is also included and is in electrical communication with both the audio source 12 and the DSP 14. A plurality of operator inputs 18, 20, 22 are provided and are each in communication with the micro-controller 16 for sending associated control signals to the micro-controller 16. In a preferred embodiment of the present invention, the operator inputs 18, 20, 22 include volume, bass boost and treble control. The DSP 14 further communicates the audio signal to a power amplifier 24, which communicates an amplified signal to attached speakers 26 for generating sound. The power amplifier 24 preferably includes a clip detector 28 for generating a clip signal as the audio signal reaches a predefined power limit. The power amplifier 24 is in communication with the micro-controller 16 for sending the clip signal to the micro-controller 16.

The micro-controller 16 manages the overall function of the audio reproduction system 10, taking into account operator inputs such as volume, bass boost and treble control. Depending upon the operator's input the micro-controller 16 sends digital control signals to the DSP 14 for controlling the variable gain stage of the audio signal processing. The control signals command the DSP 14 to determine gain for both a narrowband signal (i.e. bass) and a wideband signal (i.e. volume). The modified audio signal is then sent to the power amplifier 24. The power amplifier 24 applies a fixed gain to the audio signal received from the DSP 14. The clip detector 28 of the power amplifier detects clipping distortion in the audio signal and generates a clip signal to signal the micro-controller 16 that clipping has occurred.

Figure 2:
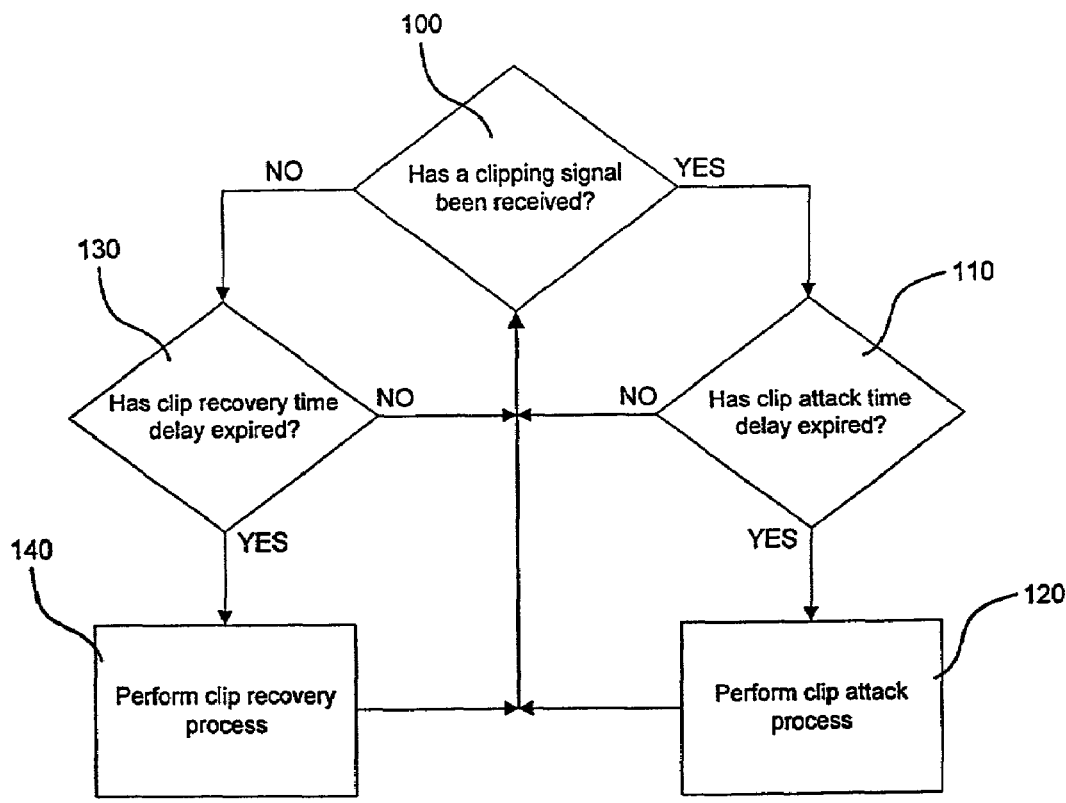
FIG. 2 is a flow diagram detailing an audio distortion processing algorithm according to the method of the present invention.

Referencing FIG. 2, the audio-processing algorithm of the present invention will be described in detail. It should be initially noted, however, that the micro-controller 16 is pre-programmed with the algorithms of the present invention for performing the audio-processing according to the method of the present invention. At step 100, it is initially determined whether or not a clip signal has been received. If a clip signal has been received, step 110 determines whether or not a clip attack time delay has expired. The clip attack time delay is essentially a waiting period to determine if the detected clipping was an isolated event or a persistent occurrence. The clip attack time delay is relatively short (e.g. several milliseconds). If the attack time delay has not yet expired, the micro-controller 16 reverts to step 100 to again determine if a clip signal is present. If the attack time delay has expired, the clip attack process is performed at step 120. If at step 100, however, a clip signal has not been received, the micro-controller 16 moves to step 130 for determining whether or not a clip recovery time delay has expired. The clip recovery time delay is a waiting period, similar to the clip attack time delay, to ensure that a clip recovery process is not initiated too soon (i.e. prior to the elimination of clipping). The clip recovery time delay is relatively short (e.g. several milliseconds). If the clip recovery time delay has expired, the micro-controller performs the clip recovery process at step 140.

In general, the clip attack algorithm of the present invention incrementally reduces the bass boost level up to a maximum amount, until clipping ceases. If clipping fails to desist after achieving the maximum reduction, the clip attack algorithm incrementally reduces the volume level up to a maximum amount. The maximum level of reduction in bass boost is a function of the amount of bass boost an operator has input. In a preferred embodiment of the present invention, the maximum level of reduction is equal to one half of the input level. For example, if an operator inputs an eight (8) dB bass boost, the maximum level of reduction in bass boost is four (4) dB. However, if an operator has not input a bass boost value, the algorithm only reduces the volume. The maximum level of reduction in volume is a function of a predefined system maximum and the maximum level of reduction in bass boost. In accordance with a preferred embodiment of the present invention, the maximum level of reduction in volume is equal to the difference between the system maximum and the maximum level of reduction in bass boost. For example, if the system maximum is equal to seven (7) dB and the maximum level of reduction in bass boost is equal to four (4) dB, the maximum level of reduction in volume is equal to three (3) dB. In this manner, the bass boost reduction is a function of a user input and the volume reduction is a function of both a user input and a system maximum. Therefore, both maximum reduction levels are variable according to operator influence.

Figure 3:
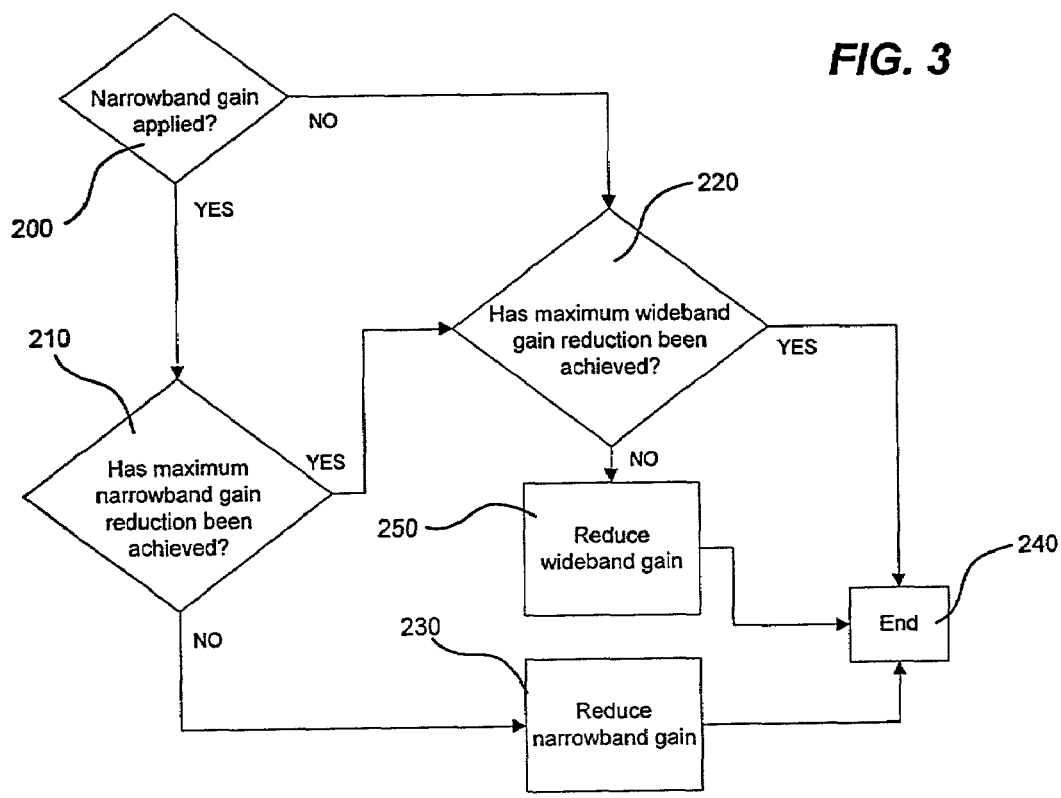
FIG. 3 is a flow diagram detailing a clip attack algorithm of the audio distortion processing for limiting distortion.

With particular reference to FIG. 3, the clip attack algorithm will be described in detail. At step 200, it is initially determined if an operator has applied narrowband gain (i.e. bass boost). If the operator has applied narrowband gain, at step 210, the micro-controller 16 determines whether or not the maximum level of reduction in narrowband gain has been achieved. If the maximum level of reduction in narrowband gain has been achieved, at step 220 the micro-controller 16 determines whether or not the maximum level of reduction in wideband gain (i.e. volume) has been reached. If at step 200, the operator has not applied narrowband gain, the clip attack algorithm moves to step 220. If the maximum level of reduction in narrowband gain has not been achieved as determined at step 210, the micro-controller 16 signals the DSP 14 to reduce the narrowband gain by an increment at step 230. In a preferred embodiment of the present invention the incremental value is one (1) dB, however, it will be appreciated that the incremental value may vary as design preference dictates. Having reduced the narrowband gain by the incremental value, the clip attack algorithm ends at step 240. However, if the micro-controller 16 determines at step 220 that the maximum wideband gain reduction has not been reached, the micro-controller 16 signals the DSP 14 to reduce the wideband gain by an increment, at step 250. In a preferred embodiment of the present invention the incremental value is one (1) dB, however, it will be appreciated that the incremental value may vary as design preference dictates. Having reduced the wideband gain by the incremental value, the clip attack algorithm ends at step 240. If, on the other hand, the micro-controller 16 determines that the maximum wideband gain reduction has been reached, the clip attack algorithm ends at step 240.

The objective of the clip attack algorithm is to eliminate clipping and thus eliminate audio distortion. However, once clipping has been eliminated, the audio-processing algorithm implements a recovery algorithm for incrementally increasing the previously reduced narrowband and wideband gains (i.e. bass boost and volume levels). In general, the recovery algorithm of the present invention functions on a "last in, first out" basis wherein the wideband gain is recovered prior to recovering the narrowband gain (the clip attack algorithm functions to decrease the narrowband gain and then the wideband gain).

Figure 4:
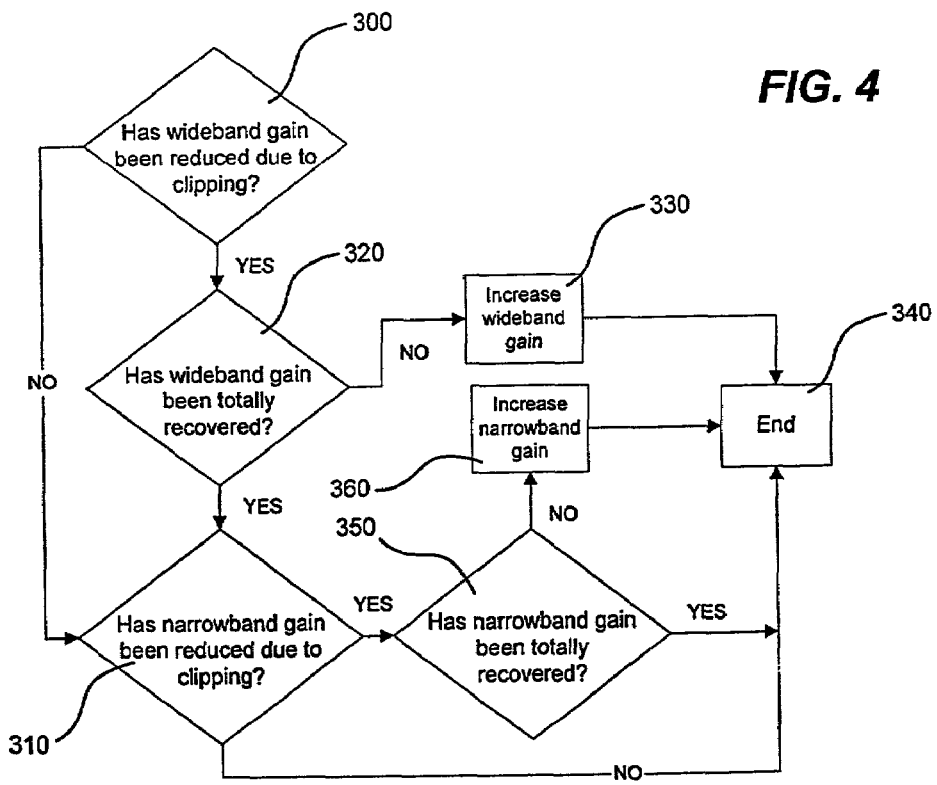
FIG. 4 is a flow diagram detailing a recovery algorithm of the audio distortion processing algorithm for recovering audio signals.

With particular reference to FIG. 4, the recovery algorithm will be described in detail. At step 300, the micro-controller 16 initially determines whether the wideband gain has been reduced as the result of clipping. If the wideband gain has not been reduced due to clipping, the recovery algorithm advances to step 310 to determine if the narrowband gain has been reduced due to clipping. However, if the wideband gain has been reduced due to clipping the micro-controller 16 determines whether the wideband gain has been totally recovered, at step 320. If the wideband gain is not totally recovered the micro-controller 16 sends a signal to the DSP 14 to incrementally increase the wideband gain, at step 330. Having incrementally increased the wideband gain, the recovery algorithm ends at step 340. However, if the wideband gain has been totally recovered the micro-controller 16 moves to step 310 to determine whether the narrowband gain has been reduced due to clipping. If the narrowband gain has not been reduced due to clipping the recovery algorithm ends at step 340. However, if the narrowband gain has been reduced due to clipping the micro-controller 16 determines whether the narrowband gain has been totally recovered, at step 350. If the narrowband gain has been totally recovered the recovery algorithm ends at step 340. However, if the narrowband gain has not been totally recovered the micro-controller 16 signals the DSP 14 to incrementally increase the narrowband gain at step 360. Having incrementally increased the bass boost, the recovery algorithm ends at step 340.

The audio-processing algorithm of the present invention improves the overall sound quality and listening comfort. By initially reducing the narrowband gain (i.e. bass boost), in the event of clipping, the audio signal change is less noticeable by listeners. Conversely, by initially recovering the wideband gain (i.e. volume) that has been reduced due to clipping, the audio distortion process remains less noticeable to listeners and is thus advantageous over prior art audio reproduction systems. Further, the bass boost and volume reduction limits of the present invention are a function of operator input. In this manner, the audio distortion processing of the present invention accounts for operator preference, again holding specific advantages over prior art audio reproduction systems The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An audio distortion processing system comprising:
    a first processing unit that receives an audio signal from an audio source, wherein said first processing unit controls a plurality of parameters for said audio signal;
    a power amplifier in electrical communication with said first processing unit for receiving an output signal of said first processing unit, said power amplifier selectively generating a clipping signal, said power amplifier adapted to be in communication with at least one speaker;
    a second processing unit in electrical communication with said power amplifier and said first processing unit for receiving said clipping signal from said power amplifier and sending control signals to said first processing unit; and
    a plurality of inputs in communication with said second processing unit, said plurality of inputs respectively indicating values of said plurality of parameters;
        wherein said control signal initiates an incremental reduction in a level of a first narrowband parameter of said plurality of parameters until one of either said clipping signal recedes or a reduction limit of said first narrowband parameter is achieved and then incremental reduction in a level of a second wideband parameter of said plurality of parameters if a reduction limit of said first narrowband parameter is achieved and said clipping signal persists, thereby reducing distortion in said audio signal,
        wherein said second processor determines that said level of said second wideband parameter has been reduced in response to said clipping signal before said second processor determines that said level of said first narrowband parameter has been reduced in response to said clipping signal, and
        wherein said control signals initiate an incremental recovery of an original level of said second wideband parameter if said clipping signal is not detected and then an incremental recovery of an original level of said first narrowband parameter if said original level of said second wideband parameter is fully recovered and said clipping signal is not detected, wherein said incremental recovery of said original level of said second wideband parameter followed by said incremental recovery of said original level of said first narrowband parameter reduces a noticeable change in an audible output of the system caused by operations of said second processing unit.

2. The audio distortion processing system of claim 1, wherein said reduction limit of said first narrowband parameter is a function of said first input of said plurality of inputs.

3. The audio distortion processing system of claim 1, wherein said reduction limit of said first narrowband parameter is equal to one half of said original level of said first narrowband parameter.

4. The audio distortion processing system of claim 1, wherein said reduction limit of said second wideband parameter is a function of said reduction limit of said first narrowband parameter.

5. The audio distortion processing system of claim 1, wherein said reduction limit of said second wideband parameter is equal to the difference between a maximum reduction value of said second wideband parameter and said reduction limit of said first narrowband parameter.

6. The audio distortion processing system of claim 1, wherein said first narrowband parameter is bass and a corresponding first input of the plurality of inputs is operator selectable bass boost.

7. The audio distortion processing system of claim 6, wherein said second wideband parameter is volume and a corresponding second input of the plurality of inputs is operator selectable volume level.

8. The audio distortion processing system of claim 1, further comprising the at least one speaker that generates said audible output based on said audio signal and said control signals, wherein said reduction in noticeable change in said audio signal caused by operations of said second processing unit is detectable in said audible output.

9. The audio distortion processing system of claim 1, wherein said audible output is based on said audio signal after said distortion is reduced for said audio signal.

10. A method for controlling distortion in an audio signal received in an audio system having a first narrowband parameter and a second wideband parameters wherein each of said first narrowband parameters and said second wideband parameter is a function of an operator input, and method comprising the steps of:
    determining a reduction limit of said first narrowband parameter;
    determining a reduction limit of said second wideband parameter;
    detecting a clipping signal in an audio signal;

incrementally reducing a level of said first narrowband parameter until one of either said clipping signal recedes or said reduction limit of said first narrowband parameter is achieved;

incrementally reducing a level of said second wideband parameter if said reduction limit of said first narrowband parameter is achieved and said clipping signal persists, thereby reducing distortion in said audio signal;

determining that said level of said second wideband parameter has been reduced in response to said clipping signal and then determining that said level of said first narrowband parameter has been reduced in response to said clipping signal; and incrementally recovering an original level of said second wideband parameter if said clipping signal is not detected and incrementally recovering an original level of said first narrowband parameter if said original level of said second wideband parameter is fully recovered and said clipping signal is not detected, wherein said incrementally recovering said original level of said first wideband parameter and said incrementally recovering said original level of said first narrowband parameter reduce a noticeable change in an audible output of the system.

11. The method of claim 10, wherein said first narrowband parameter is a bass parameter and said second wideband parameter is a volume parameter.

12. The method of claim 10, wherein said reduction limit of said first narrowband parameter is a function of an operator input.

13. The method of claim 10, wherein said reduction limit of said first narrowband parameter is equal to one half of an operator selectable first narrowband parameter level.

14. The method of claim 10, wherein said reduction limit of said second wideband parameter is a function of said reduction limit of said first narrowband parameter.

15. The method of claim 10, wherein said reduction limit of said second wideband parameter is equal to the difference between a maximum reduction limit of said second wideband parameter and said reduction limit of said first narrowband parameter.

* * * * *